United States Patent [19]

Tokura et al.

[11] Patent Number: 4,985,743
[45] Date of Patent: Jan. 15, 1991

[54] INSULATED GATE BIPOLAR TRANSISTOR

[75] Inventors: Norihito Tokura, Okazaki; Hiroyasu Ito; Naoto Okabe, both of Kariya, all of Japan

[73] Assignee: Nippondenso Co., Ltd., Kariya, Japan

[21] Appl. No.: 221,354

[22] Filed: Jul. 19, 1988

[30] Foreign Application Priority Data

Jul. 21, 1987 [JP] Japan .................................. 62-181809
Apr. 15, 1988 [JP] Japan .................................... 63-93692

[51] Int. Cl.$^5$ .................... H01L 29/747; H01L 29/10; H01L 29/78; H01L 29/72
[52] U.S. Cl. ..................................... 357/39; 357/23.4; 357/34; 357/51
[58] Field of Search ................. 357/39, 23.4, 34, 59 F, 357/59 G, 59 H

[56] References Cited

U.S. PATENT DOCUMENTS 4,364,073 12/1982 Becke et al. .
4,406,051 9/1983 Iizuka ............................ 357/59 F
4,495,513 1/1985 Descamps ............................ 357/43

FOREIGN PATENT DOCUMENTS 3114971 1/1982 Fed. Rep. of Germany ..... 357/23.4
57-211773 2/1982 Japan .
60-196974 10/1985 Japan .

OTHER PUBLICATIONS

"NIKKEI Electronics", May 19, 1986, No. 395, p. 183.

Primary Examiner—Rolf Hille
Assistant Examiner—D. M. Ostrowski
Attorney, Agent, or Firm—Cushman, Darby & Cushman

[57] ABSTRACT

This invention is basically related to an insulated gate bipolar transistor comprising a first conductivity type semiconductor substrate, a second conductivity type semiconductor layer formed on the substrate and having a low concentration of impurities, a first conductivity type base layer formed on a surface of the semiconductor layer, a second conductivity type source layer formed on the surface of the base layer and having a channel region at at least one end thereof, a gate electrode, a source electrode and a drain electrode, and is characterized in that a voltage dropping portion is provided either inside the source layer or between the source layer and the source electrode. Accordingly an insulated gate bipolar semiconductor transistor having this configuration can prevent a latch up phenomenon caused by a voltage drop in a source layer.

18 Claims, 4 Drawing Sheets

INSULATED GATE BIPOLAR TRANSISTOR

BACKGROUND OF THE INVENTION

1. Field of the Invention

This invention relates to an insulated gate bipolar transistor which can be used as an element of an electric switch for electric power.

2. Description of the Related Arts

There have been many reports recently related to an insulated gate bipolar transistor used as an element of an electric switch for electric power.

This kind of element usually has a P-N-P-N configuration similar to that of a usual power MOSFET, but this insulated gate bipolar transistor enables a high withstand voltage and a low ON resistance to be obtained simultaneously, which has been heretofore considered impossible in a usual power MOSFET, by reducing the ON resistance caused by a modulation of a conductivity of a drain layer having a high resistance layer by providing a semiconductor layer, having an opposite type of conductivity to a source layer, in a drain region.

This kind of insulated gate bipolar transistor has a P-N-P-N four layered construction between a drain electrode and a source electrode. Although it is similar to a thyristor, it does not work as a thyristor because the source electrode thereof causes a short circuit between a P-type base layer and N+-type source layer, and the semiconductor element is always turned OFF by setting the voltage between a gate electrode and a source electrode to zero.

Nevertheless, another problem arises with this kind of insulated gate bipolar transistor. Namely, when a current density which flows in the element is increased, a voltage drop caused by a transverse resistance existing under a source layer is also increased, and therefore, this element is forced to work as a thyristor because the junction surface between the P-type base layer and N+-type source layer is forward biased, and accordingly, a latch up phenomenon occurs in which, even when a bias between a gate and a source is set to zero, the current of the semiconductor element is not turned OFF.

To overcome the above problem, a method in which the latch up phenomenon can be prevented even in a region in which a large amount of current is used, by minimizing the transverse voltage drop caused by lowering the resistance of the base layer just below the source layer, was proposed in, for example, Japanese Unexamined Patent Publication No. 60-196974.

Nevertheless, if the operating temperature is higher than 125° C., even if only a slight transverse voltage drop in the base layer existing just below the source layer occurs, the junction surface between the P-type base layer and N+-type source layer will be forward biased and the above latch up phenomenon will occur, and therefore, this method does not solve the above problem.

Further, even when operating at room temperature, if there is a flow of a large amount of current greater than the current flowing in a region wherein a latch up phenomenon has never occurred, the latch up phenomenon will ultimately occur and, consequently, the basic cause of this latch up phenomenon can not be removed.

SUMMARY OF THE INVENTION

In view of the above problems, the object of the present invention is to provide an insulated gate bipolar semiconductor transistor having a configuration by which a latch up phenomenon caused by a voltage drop in the source layer is prevented.

To attain the above object, in the present invention, a voltage dropping portion is provided either inside of a source layer or between the source layer and a base layer, and an insulated gate bipolar transistor of this invention is further characterized by comprising a first conductivity type semiconductor substrate, a second conductivity type semiconductor layer formed on the substrate and having a low concentration of impurities, a first conductivity type base layer formed on a surface of the semiconductor layer, a second conductivity type source layer formed on the surface of the base layer and having a channel region at least one end thereof, a gate electrode, a source electrode, and a drain electrode, wherein a voltage dropping portion is provided in a region either inside the source layer or between the source layer and the source electrode.

According to the present invention, a junction portion between a source layer and a base layer is forcibly prevented from entering a forward bias state by applying a voltage drop created in a voltage dropping portion to at least either a portion inside of a source layer or a portion between a source layer and a base layer, to thereby ensure that a latch up phenomenon substantially cannot occur at a high temperature or when a large amount of current is used.

DESCRIPTION OF THE PREFERRED EMBODIMENTS

Figure 1:
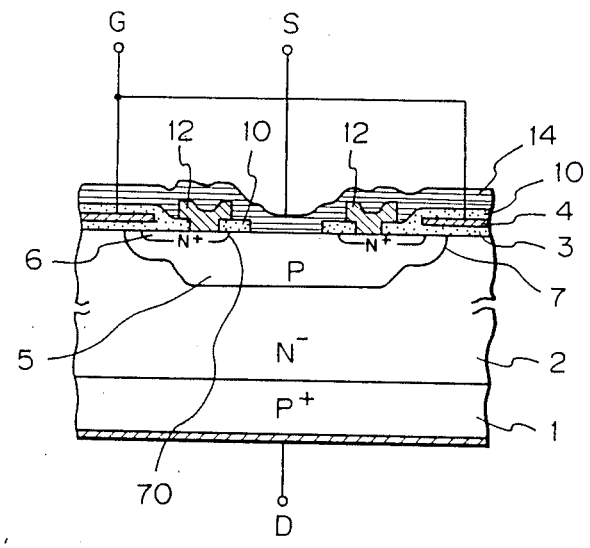
FIG. 1 is a cross sectional view of a construction of an insulated gate bipolar transistor of a first embodiment of the present invention.

This invention will be now explained by describing the preferred embodiments thereof, with reference to the accompanying drawings.

FIRST EMBODIMENT

The first embodiment of the present invention will be described with reference to FIG. 1, by explaining the manufacturing method of this invention.

First, a P+-type silicon semiconductor substrate 1 is prepared and an N−-type semiconductor layer 2 having a low concentration of impurities and a resistivity of more than 50 Ω-cm is formed on the substrate 1 by an epitaxial growth method, to a thickness of about 100 μm, a gate oxide film 3 is then formed on the N⁻-type layer 2 by oxidizing the surface thereof, a gate electrode 4 made of a polycrystalline silicon film having a thickness of about 5000 Å is formed on the gate oxide film 3, and thereafter, a P-type base layer 5 is formed inside of the N⁻-type layer 2 by diffusing boron with a dose value of $3 \times 10^{14}$ cm$^{-2}$ to about 3 μm while using the gate electrode 4 as a mask.

Next, after covering only the center portion of a window defined by the gate electrode 4 with an oxide film (not shown), an N⁺-type source layer 6 is formed by ion implantation of phosphorus ions with a dose value of $1 \times 10^{15}$ cm$^{-2}$ while using the gate electrode 4 and oxide film 3 as a mask, and successive heat treatments are carried out to thereby form a channel 7 by a Diffusion Self Alignment process (DSA), in which both the P-type base layer 5 and the N⁺-type source layer 6 are positioned while using the gate electrode 4 as a common mask.

The oxide film 3 is then etched and an interlayer insulating film 10 is obtained by forming an oxide film (not shown) by a CVD method and etching the not shown oxide film.

A part of the insulating film 10 corresponding to the portion of the source layer 6 is then removed by, for example, etching, to make an opening and, thereafter, a polycrystalline silicon film voltage dropping portion 12 having a resistivity of about 2 Ω-cm and a thickness of about 1 μm is formed on the opening by using a suitable mask.

Subsequently, a source electrode 14 made of an aluminum film is formed by vacuum evaporation and patterning with a suitable mask, and finally, a drain electrode 15 is formed on an opposite side of the substrate 1 by depositing a metal film thereon by an evaporation method, to thereby obtain the insulated gate bipolar transistor of the present invention.

By utilizing the method of this embodiment, the voltage dropping portion 12 can be provided on any desired portion, and further, the surface of the junction 70 between the source layer 6 and the base layer 5 can be covered with the interlayer insulating film 10.

SECOND EMBODIMENT

Figure 2:
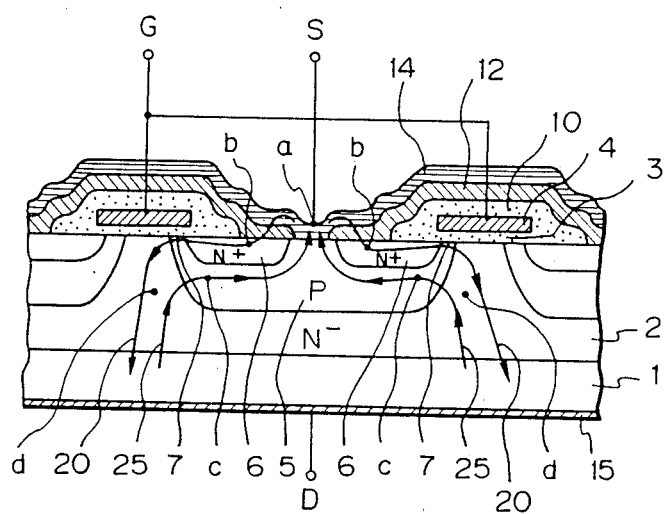
FIG. 2 is a cross sectional view of a construction of an insulated gate bipolar transistor of a second embodiment of the present invention.

FIG. 2 shows an insulated gate bipolar transistor made by a process according to a second embodiment of the present invention.

In this embodiment, the configuration of the voltage dropping portion 12 of the transistor is different from that of the transistor of the first embodiment, in that the voltage dropping portion 12 covers the gate electrode 4, and therefore, the method of manufacturing this insulated gate bipolar transistor is different from that of the first embodiment.

Namely, the steps up to the forming of the interlayer insulating film 10 in the first embodiment are also applied in the second embodiment, but steps after forming the insulating film 10 are different in that, after the insulating film 10 is formed, a polycrystalline silicon film having a resistivity of about 2 Ω-cm and a thickness of about 1 μm is formed over the insulating film 10 and a portion between the films 10 and the voltage dropping portion 12 consisting of a polycrystalline silicon resistance film is formed by removing a portion of the silicon film covering the surface of the P-type base layer 5, by etching.

Hereafter, the operation of the insulated gate bipolar transistor obtained in the first and second embodiments shown in FIGS. 1 and 2, respectively, will be explained with reference to FIG. 2 and FIG. 3.

When a positive voltage is applied to the gate electrode 4, a channel 7 is turned ON and thus electrons flow in the direction indicated by an arrow 20 in FIG. 2. Namely, the electrons flow sequentially through the source electrode 14→polycrystalline silicon resistance film, i.e., the voltage dropping portion 12→N⁺-type source layer 6→channel 7→N⁻-type drain layer 2→P⁺-type drain layer 1→drain electrode 15. Contrary to this flow of electrons, a hole is implanted from the P⁺-type drain layer 1 into the N⁻-type drain layer 2 and flows in the direction indicated by an arrow 25, i.e., flows sequentially through the P⁺-type drain layer 1→N⁻-type drain layer 2→P-type base layer 5→source electrode 14.

A current ratio K, which is a ratio of a current of a first carrier $I_1$ to a current of a second carrier $I_2$, is defined by $k = I_2/I_1$.

For FIG. 2, the current ratio k is, for example, a ratio of the hole current Ih as shown by the curved arrow line 25 in FIG. 2 to the electron current Ie as shown by the curved arrow line 20 in FIG. 2, is defined by the following equation (1).

$$k = Ih/Ie \qquad (1)$$

The value k is determined by a condition of a junction between the N⁻-type drain layer 2 and the P⁺-type drain layer 1, and an existing ratio of the hole in the N⁻-type drain layer 2.

In these embodiments, the k value may be, for example, 5.

Figure 3:
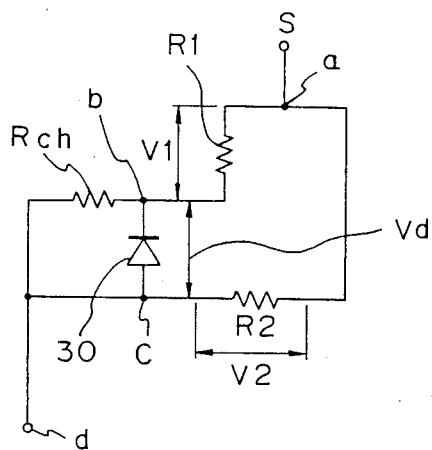
FIG. 3 shows an equivalent circuit for explaining the operation of the transistor of the first and second embodiments of the present invention.

An electric circuit equivalent to the construction of the insulated gate bipolar transistor of the present invention as shown in FIGS. 1 and 2, is shown in FIG. 3.

In FIG. 3, a resistor $R_1$ is an equivalent resistance corresponding to that of the polycrystalline silicon resistance film 12 when the electrons flow in the direction shown by the arrow 20, and a voltage $V_1$ is a terminal voltage of the resistor $R_1$ and corresponds to a voltage difference between a point a and a point b', a resistor $R_2$ is an equivalent resistance corresponding to that of the P-type base layer 5 when the hole flows in the direction shown by the arrow 25, and a voltage $V_2$ is a terminal voltage of the resistor $R_2$ and corresponds to a voltage difference between a voluntary point a on the source electrode 14 and a point c in the region of the base layer 5 just below the source layer 6; and a resistor $R_{ch}$ is an equivalent resistance corresponding to that of the channel 7 and a diode 30 is a P-N-type junction diode corresponding to one of a portion of a junction surface consisting of the N⁺-type source layer 6 and the P-type base layer 5 and provided near to a voluntary point c in the region of the base layer 5 just below the source layer 6, and a voltage $V_d$ is a terminal voltage of the diode 30 and a terminal d corresponds to a voluntary point in the N⁻ type drain layer 2.

The operation of the insulated gate bipolar transistor of the first and second embodiments of this invention will be now explained with reference to FIG. 3.

When a voltage $V_{gs}$ applied to the gate electrode 4 is increased and a voltage $V_{ds}$ applied to the drain electrode 15 is also increased, an electron current Ie is first increased, and simultaneously, a hole current Ih is increased, in accordance with the equation (1).

The voltages $V_1$, $V_2$, and $V_d$ are represented by the following equations, respectively:

$$V_1 = Ie \times R_1 \tag{2}$$

$$V_2 = Ih \times R_2 \tag{3}$$

$$V_d = V_2 - V_1 \tag{4}$$

To represent the voltage $V_d$ as a function of the electron current Ie, the following equation can be obtained from the equations (1) to (4).

$$V_d = Ie \, (k \times R_2 - R_1) \tag{5}$$

Note, the term $(k \times R_2 - R_1)$ in the equation (5) is usually positive, i.e., $$(k \times R_2 - R_1) > 0 \tag{6}$$

and therefore, $V_d$ is always positive ($V_d > 0$).

The silicon diode 30 is usually turned ON at about 0.7V at room temperature at about an absolute temperature of 300° K., and when the diode 30 is turned ON, a part of the hole current Ih which flows along the curve indicated by the arrow 25 is bypassed to flow from the terminal c to the terminal b, and simultaneously, a part of the electron current Ie flowing along the curve indicated by the arrow 20 is also bypassed to flow from the terminal b to the terminal c, and accordingly, a latch up phenomenon occurs, based upon the operational theory of a thyristor, due to the bypassing of the electrons and the hole.

Moreover, when the temperature reaches 125° C., the threshold ON voltage of the diode 30 is reduced from 0.7V to 0.4V. Further, since the resistor $R_2$ is a bulk resistor of the P-type base layer 5, the resistance thereof will be increased as the temperature is increased, and consequently, the higher the temperature, the greater the reduction of the limitation of the current value at which a latch up phenomenon will occur.

As described above, in the prior art, the value $(k \times R_2 - R_1)$ is usually positive, and therefore, a latch up phenomenon easily occurs, but in this invention, the value $V_d$ can be made zero or can have a negative value ($V_d \leq 0$) by obtaining the value of the resistor $R_1$ of the polycrystalline silicon resistance film 12 from the following equation, $$(k \times R_2 - R_1) \leq 0 \tag{7}$$

and, therefore, the diode 30 cannot be forwardly biased regardless of the strength of the electron current Ie. Accordingly, a latch up phenomenon caused by the bypassing of the electrons and the hole can be effectively prevented, and thus, in the first and second embodiments of this invention, an insulated gate bipolar transistor which effectively prevents such a latch up phenomenon can be obtained.

Further, in the present invention, even if equation (7) can not be realized, an insulated gate bipolar transistor having a higher current limitation value at which a latch up phenomenon will occur can be obtained, as apparent from equation (5), because the value of the term $(k \times R_2 - R_1)$ is reduced by the addition of the value of the resistance $R_1$.

THIRD EMBODIMENT

Figure 4:
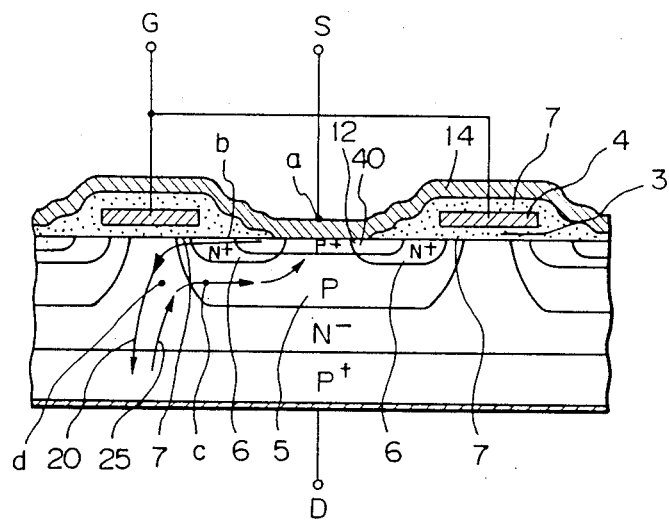
FIG. 4 is a cross sectional view of a construction of an insulated gate bipolar transistor of a third embodiment of the present invention.

FIG. 4 shows a third embodiment of an insulated gate bipolar transistor according to the present invention. In FIG. 4, the elements corresponding to those of FIG. 2 are given the same reference number as the same elements in FIG. 2.

In this third embodiment, a voltage dropping portion 12 consisting of a P+-type layer 40 is formed by implanting boron with a dose value of $5 \times 10^{15}$ cm$^{-2}$ into a surface of the N+-type source layer 6, instead of using the polycrystalline silicon resistance film 12 as the voltage dropping portion as in the second embodiment.

By the P+ type layer 40 provided between the N+-type source layer 6 and the source electrode 14, a P+-N+-type junction diode can be formed between said N+-type source layer 6 and said source electrode 14, in this third embodiment of the insulated gate bipolar transistor according to the present invention.

Figure 5:
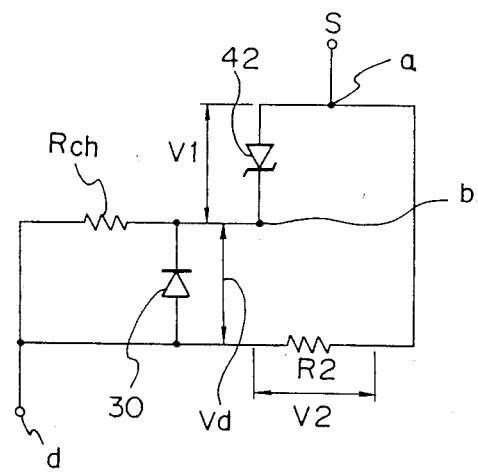
FIG. 5 shows an equivalent circuit for explaining the operation of the transistor of the third embodiment of the present invention.

An electric circuit equivalent to the construction of the insulated gate bipolar transistor of the third embodiment is shown in FIG. 5. Note, in FIG. 5, a zener diode 42 having a P+-N+-type junction is provided instead of the resistor $R_1$ in the equivalent circuit of the second embodiment.

Figure 6:
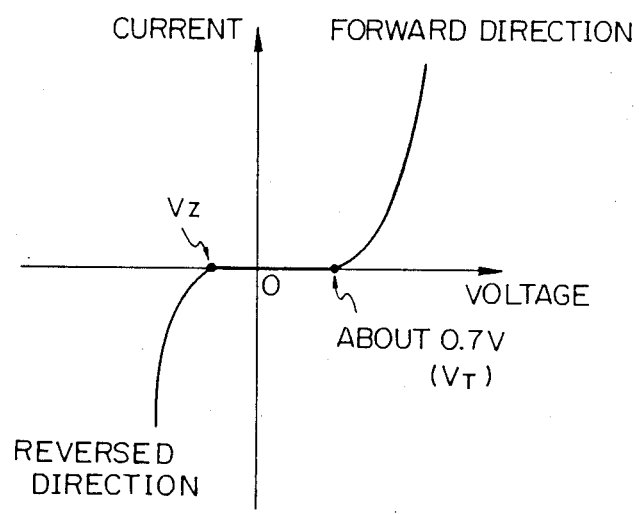
FIG. 6 shows an electrical characteristic of a Zener diode used in the third embodiment of the present invention.

The electrical characteristic of the zener diode 42 is determined by a distribution of impurities in the P+-type layer 40 and the N+-type source layer 6, and the configuration, atmospheric temperature, and characteristic thereof are shown in FIG. 6.

The operation of the transistor of this third embodiment will be now described with reference to FIG. 5.

In this third embodiment, as apparent from the equivalent circuit shown in FIG. 5, the zener diode 42 is biased in a reverse direction, and the voltage drop $V_z$ of the zener diode 42 is about 0.5-1V.

By replacing the resistor $R_1$ in the first and second embodiments with the zener diode 42, the following equation (8) will be obtained from the equations (1) to (7).

$$V_d = Ie \times k \times R_2 - V_z \tag{8}$$

As apparent from equation (8), an insulated gate bipolar transistor able to prevent a latch up phenomenon can be obtained by this third embodiment, since the voltage $V_d$ can be reduced due to the voltage drop $V_2$ (0.5-1V) of the zener diode 42.

FOURTH EMBODIMENT

Figure 7:
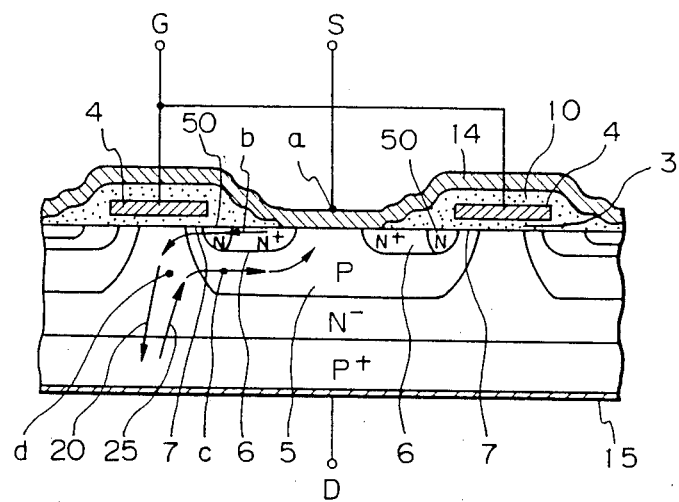
FIG. 7 is a cross sectional view of a construction of an insulated gate bipolar transistor of a fourth embodiment of the present invention; and, FIG. 8 is a cross sectional view of a construction of an insulated gate bipolar transistor of a fifth embodiment of the present invention.

FIG. 7 shows a fourth embodiment of an insulated gate bipolar transistor according to the present invention.

The manufacturing steps up to the forming of the N+-type source layer 6 of the first and second embodiments are all applied to this fourth embodiment, but in this embodiment, after the forming of the N+-type source layer 6, the oxide film (not shown) provided at least on the surface of the source layer 6 is removed by etching and then another oxide film (not shown) is provided at least on the layer 6 to act as a mask with the gate electrode 4 to provide an opening existing only on one of the ends of the N+-type source layer 6 adjacent to the gate electrode 4.

Thereafter, an N-type source layer 50, i.e., a voltage dropping portion, is formed in a portion of the N+-type source layer 6 by implanting boron impurities at a low concentration i.e. with a dose value of $7 \times 10^{14}$ cm$^{-2}$.

Then, the oxide film mentioned above is etched and an interlayer insulating film 10 is formed by forming another oxide film by a CVD method and etching that oxide film, and further, a source electrode 14 made of an aluminum film is formed by vacuum evaporation and patterned with a suitable mask.

Finally, a drain electrode 15 is formed on an opposite side of the substrate 1 by forming a metal film thereon by an evaporation method, to thereby obtain the insulated gate bipolar transistor of this embodiment.

In this fourth embodiment, an N-type source layer 50 is formed on the portion adjacent to the gate electrode 4 inside of the N+-type source layer 6, and acts as a resistor to the electron current in the N+-type source layer 6.

The equivalent circuit of the fourth embodiment is the same as that of first and second embodiments, as shown in FIG. 3, except that the resistor $R_1$ in FIG. 3 is replaced by the resistance in the N-type source layer 50, and therefore, the operation of the transistor of this fourth embodiment is exactly the same as that of the transistor of the first and second embodiments.

The advantage of the transistor of the fourth embodiment is that, by using the method thereof, the thickness of the film of the voltage dropping portion can be reduced because the N-type source layer 50 is formed inside of the N+-type source layer 6.

FIFTH EMBODIMENT

Figure 8:
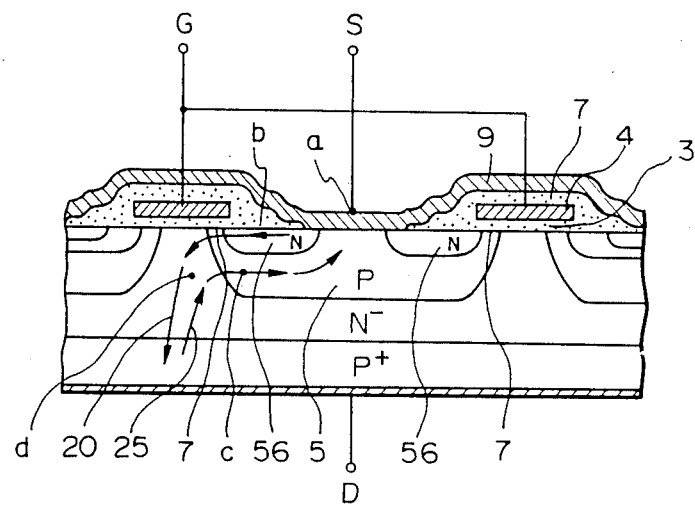

FIG. 8 shows a fifth embodiment of an insulated gate bipolar transistor according to the present invention.

In this embodiment, the manufacturing steps up to the forming of the N+-type source layer 6 of the first and second embodiments are all applied, but in this embodiment, after forming the N+-type source layer 6, an N-type source layer 56, i.e., a voltage dropping portion, is formed wholly inside of the N+-type source layer 6 by implanting boron impurities with a dose value of $7 \times 10^{14}$ cm$^{-2}$ into the N+-type source layer 6 without removing the not shown oxide film by etching.

The equivalent circuit of this embodiment is the same as that of the first and second embodiments as shown in FIG. 3, except that the resistor $R_1$ in FIG. 3 is replaced by a resistance having a relatively higher resistance value in the N-type source layer 56 having a relatively low impurities concentration, and therefore, the operation of the transistor of this embodiment is exactly the same as that of the first and second embodiments.

The advantage of the transistor of the fifth embodiment is that the voltage dropping portion can be formed without forming a separate oxide film for use as a mask.

In the first and second embodiments, the polycrystalline silicon resistance film 12 is used as a voltage dropping portion, but the material of the voltage dropping portion is not restricted to polycrystalline silicon but can be any material having the desired specific resistance; for example, a silicide, alloy, metal or other semiconductor, may be used in this invention.

Also, the position at which the polycrystalline silicon resistance film 12 is formed is not restricted to the position shown in FIGS. 1 and 2, and may be formed at least as a portion between the source electrode and N+-type source layer or inside of the source electrode. Preferably the resistance film 12 has a desired resistance.

Moreover, in all of the above embodiments, the conductivity type of each element can be reversed to the opposite type of conductivity.

According to this invention, a latch up phenomenon of the insulated gate bipolar transistor is effectively prevented.

We claim:

1. An insulated gate bipolar transistor, which comprises:
    a first conductivity type semiconductor substrate;
    a second conductivity type semiconductor layer, formed on and above said substrate;
    a base layer of said first conductivity type formed on at least a surface of said semiconductor layer;
    a source layer formed on at least a surface of said base layer, whereby a PN junction is formed between said source layer and said base layer, and said source layer is arranged therein in such a manner to form a channel region in said base layer and between said source layer and said semiconductor layer;
    a gate electrode formed above said channel region;
    a gate insulating film interposed between said channel region and said gate electrode;
    a source electrode, electrically coupled to said base layer and to said source layer;
    wherein, when said channel region is made conductive by applying an electrical voltage to said gate electrode, a first passage is formed in which a first carrier flows from said source electrode to said semiconductor substrate through said source layer, said channel region and said semiconductor layer, and simultaneously, a second passage is formed in which a second carrier flows from said semiconductor substrate to said source electrode through said semiconductor layer and said base layer; and
    a voltage dropping portion in a predetermined passage for said first carrier between said source electrode and said source layer;
    wherein said electrode has a portion thereof provided over a predetermined surface portion of said source layer and said voltage dropping portion includes a resistance film provided between said predetermined portion of said source layer and said source electrode, provided directly above the predetermined portion of said source layer in a way to provide a substantially vertical voltage drop to said semiconductor layer and to prevent a combination of said semiconductor substrate, said semiconductor layer, said base layer, and said source layer from acting as a thyristor.

2. An insulated gate bipolar transistor according to claim 1, wherein said first conductivity type, of said semiconductor substrate, is P type and said second conductivity type, of said semiconductor layer, is N type, and said voltage dropping portion decreases a voltage, and has an equivalent resistance value $R_1$ which is determined in accordance with the following equation;

$$(K \times R_2 - R_1) \leqq 0$$

wherein, $R_2$ denotes an equivalent resistance value in said base layer in said passage for said second carrier and K denotes a value defined by $K = I_h/I_e$ in which $I_e$ denotes an electron current of said first carrier and $I_h$ denotes a hole current of said second carrier.

3. An insulated gate bipolar transistor according to claim 2, wherein said voltage dropping portion has a same conductivity type as that of a remaining portion of said source layer, but a concentration of impurities thereof is lower than that of said remaining portion.

4. An insulated gate bipolar transistor which comprises:
a first conductivity type semiconductor substrate;
a second conductivity type semiconductor layer formed on said semiconductor substrate;
a base layer of said first conductivity type formed on at least a surface of said semiconductor layer;
a source layer formed on at least a surface of said base layer, formed of a material such that a PN junction is formed between said source layer and said base layer, and said source layer is arranged therein in such a manner to form a channel region in said base layer between said source layer and said semiconductor layer;
a gate electrode formed on said channel region;
a gate insulating film interposed between said channel region and said gate electrode;
a source electrode electrically connected to said base layer and to said source layer;
wherein, when said channel region is made conductive by applying an electrical voltage to said gate electrode, a first passage is formed in which a first carrier flows from said source electrode to said semiconductor substrate through said source layer, said channel region and said semiconductor layer, and simultaneously, a second passage is formed in which a second carrier flows from said semiconductor substrate to said source electrode through said semiconductor layer and said base layer; and
wherein said voltage dropping portion comprises a Zener diode formed between said source layer and a layer formed in said source layer having an opposite conductivity type to that of said source layer.

5. An insulated gate bipolar transistor, which comprises:
a first conductivity type semiconductor substrate;
a second conductivity type semiconductor layer formed on said substrate;
a base layer of said first conductivity type formed on at least a surface of said semiconductor layer;
a source layer formed on at least a surface of said base layer, formed of a material such that a PN junction is formed between said source layer and said base layer, and said source layer is arranged therein in such a manner to form a channel region in said base layer between said source layer and said semiconductor layer;
a gate electrode formed on said channel region and a gate insulating film interposed between said channel region and said gate electrode;
a source electrode electrically connected to said base layer and to said source layer;
wherein, when said channel region is made conductive by applying an electrical voltage to said gate electrode, a first passage is formed in which a first carrier flows from said source electrode to said semiconductor substrate through said source layer, said channel region and said semiconductor layer, and simultaneously, a second passage is formed in which a second carrier flows from said semiconductor substrate to said source electrode through said semiconductor layer and said base layer;
wherein said source layer is a layer having a low concentration of a predetermined impurity and at least a part of which forms a voltage dropping portion to prevent a working of a combination formed by said semiconductor substrate, said semiconductor layer, said base layer and said source layer as a thyristor due to said flow of said first and said second carriers at said PN junction.

6. An insulated gate bipolar transistor according to claim 5, wherein said first conductivity type of said semiconductor layer is P type and said second conductivity type of said semiconductor layer is N type, and said voltage dropping portion decreases a voltage, utilizing an electric resistance wherein an equivalent resistance value $R_1$ of said electric resistance is determined in accordance with the following equation;

$$(K \times R_2 - R_1) \leq 0$$

wherein, $R_2$ denotes an equivalent resistance value in said base layer in said passage for said second carrier and K denotes a value defined by $K = I_h/I_e$ in which $I_e$ denotes an electron current of said first carrier and $I_h$ denotes a hole current of said second carrier.

7. An insulated gate bipolar transistor according to claim 1, wherein said second conductivity type semiconductor layer has a low concentration of impurities.

8. An insulated gate bipolar transistor according to claim 1, wherein said voltage dropping portion is provided in a region between said source layer and said source electrode and said second conductivity type source layer is covered with an interlayer insulating film in which said gate electrode is provided at least in a vicinity of said channel region, and said voltage dropping portion is provided at an opening portion of said insulating film and is positioned on said second conductivity type source layer in contact with said source layer, and said source electrode formed as a film that covers all of the surfaces of said base layer, said insulating film and said voltage dropping portion.

9. An insulated gate bipolar transistor according to claim 8, wherein said voltage dropping portion is provided in the form of a film to cover at least a portion of the surface of said second conductivity type source layer and said interlayer insulating film having said gate electrode positioned at least in a vicinity of said channel region, wherein said source electrode covers at least the surface of said first conductivity type base layer and said film of said voltage dropping portion.

10. An insulated gate bipolar transistor according to claim 1, wherein said gate insulating film is also extendedly formed over an upper portion of said source layer, and a contacting hole is formed in an upper portion of said source layer including at least a portion of said gate insulating film extendedly formed thereon while said source electrode is formed at least on said gate insulating film extendedly formed on said source layer, said resistance film being provided between said source layer and said source electrode in said contacting hole.

11. An insulated gate bipolar transistor according to claim 10, wherein said resistance film includes a polycrystalline silicon film formed between said source layer and said source electrode.

12. An insulated gate bipolar transistor according to claim 11, wherein said resistance film has an equivalent resistance value $R_1$ which is determined in accordance with the following equation:

$$(K \times R_2 - R_1) \leq 0$$

wherein, $R_2$ denotes an equivalent resistance value in said base layer in said passage for said second carrier and K denotes a value defined by $K = I_2/I_1$ in which $I_1$ denotes current of said first carrier and $I_2$ denotes a current of said second carrier.

13. A transistor as in claim 1 wherein said voltage dropping portion is disposed in a way such that current between said source electrode and said source layer must pass through said voltage dropping layer.

14. An insulated gate bipolar transistor according to claim 12, wherein said voltage dropping portion is composed of a P-type layer provided in one end portion of said second conductivity type source layer apart from said gate electrode.

15. An insulated gate bipolar transistor according to claim 14, wherein said voltage dropping portion is formed by implanting P-type ions into said second conductivity type source layer.

16. An insulated gate bipolar transistor according to claim 12, wherein said voltage dropping portion is composed of an N-type source layer provided in one end portion of said second conductivity type source layer and adjacent to said gate electrode.

17. An insulated gate bipolar transistor according to claim 6, wherein said voltage dropping portion is composed of an N-type source layer and is provided in the whole of said second conductivity type source layer.

18. A transistor as in claim 5, wherein said predetermined impurity is Boron.

* * * * *